(12) United States Patent
Narita

(10) Patent No.: US 6,433,393 B1
(45) Date of Patent: Aug. 13, 2002

(54) SEMICONDUCTOR PROTECTIVE DEVICE AND METHOD FOR MANUFACTURING SAME

(75) Inventor: Kaoru Narita, Tokyo (JP)

(73) Assignee: NEC Corporation, Tokyo (JP)

( * ) Notice: Subject to any disclaimer, the term of this patent is extended or adjusted under 35 U.S.C. 154(b) by 54 days.

(21) Appl. No.: 09/659,067

(22) Filed: Sep. 11, 2000

(30) Foreign Application Priority Data

Sep. 9, 1999 (JP) .............................. 11-255829

(51) Int. Cl.⁷ ................................. H01L 23/62
(52) U.S. Cl. ......................... 257/355; 257/356
(58) Field of Search ................. 257/355, 356

(56) References Cited

U.S. PATENT DOCUMENTS

| | | | |
|---|---|---|---|
| 5,502,317 A | | 3/1996 | Duvvury |
| 5,872,379 A | | 2/1999 | Lee |
| 5,994,741 A | * | 11/1999 | Koizumi et al. |
| 6,281,527 B1 | * | 8/2001 | Chen |
| 6,355,959 B1 | * | 3/2002 | Vashchenko et al. |
| 6,355,960 B1 | * | 3/2002 | Lin et al. |
| 6,359,313 B1 | * | 3/2002 | Yang et al. |

FOREIGN PATENT DOCUMENTS

| | | |
|---|---|---|
| JP | 59-181044 | 10/1984 |
| JP | 62-165966 | 7/1987 |
| JP | 2669245 | 7/1997 |
| JP | 9-191082 | 7/1997 |
| JP | 9-223748 | 8/1997 |

OTHER PUBLICATIONS

US 6,351, 012, 02/2002, Hirata (withdrawn)*

* cited by examiner

Primary Examiner—Stephen D. Meier
(74) Attorney, Agent, or Firm—Young & Thompson

(57) ABSTRACT

The distance between an anode and a cathode of a thyristor and the anode and the cathode of a diode formed in a semiconductor protective circuit are made a small as allowable by LSI manufacturing technology, thereby achieving fast starting speed and a low internal resistance when in the conducting condition, so as to limit the rise in voltage on an internal circuit, even when a high-speed pulse is applied.

12 Claims, 7 Drawing Sheets

SEMICONDUCTOR PROTECTIVE DEVICE AND METHOD FOR MANUFACTURING SAME

FIELD OF THE INVENTION

The present invention relates to a semiconductor protective device, and to a method of manufacturing a semiconductor protective device.

More particularly, it relates to an on-chip static electricity protective element in a semiconductor device comprising a fine-featured complimentary MOS semiconductor integrated circuit having a minimum interconnect width of 0.5 micron or less.

DESCRIPTION OF THE RELATED ART

In the past, a semiconductor on-chip static electricity protective technology of this type has been known to persons skilled in the art, from the following literature, for example.

More specifically, as shown in FIG. 6, the U.S. Pat. No. 5,502,317 has a disclosure of an N well 142 formed on the surface of a P-type semiconductor substrate 126, a P-type diffusion layer 146 and N-type diffusion layer 144 connected to an external terminal formed therein, and N-type diffusion layer 114 formed on a semiconductor substrate 126 part of which is included in the N well 142, an N-type diffusion layer 112 connected to a ground terminal 118 and an N-type diffusion layer 122 formed on the semiconductor substrate 126, via an element separation region 124.

In this known semiconductor protective device, when an excessive positive static electricity voltage is applied to the external terminal, the PN junction formed by the N-type diffusion layer 114 and the P-type semiconductor substrate 126 exhibits an avalanche breakdown, thereby raising the potential on the substrate.

Because of this action, the NPN transistor formed by the N-type diffusion layer 114, the P-type semiconductor substrate 126, and the N-type diffusion layer 112 conducts.

Because of this, the potential in the region of the P-type diffusion layer 146 of the N well 142 decreases, so that the PNP transistor formed by the P-type diffusion layer 146, the N well 142, and the P-type semiconductor substrate 126 conducts.

As a result, the NPN transistor and PNP transistor operate in a complimentary manner so as to enhance the collector current, the result being entry into the low-resistance condition of so-called thyristor operation, thereby enabling protection of the internal circuit by causing a current to flow.

In the U.S. Pat. No. 5,872,379, which is a similar example of prior art, as shown in FIG. 7, the basic configuration is the same as shown in FIG. 6, the major difference between FIG. 6 and FIG. 7 configurations being that, in place of the element separation region 124 shown in FIG. 6, in FIG. 7 a P-type diffusion layer 38 having a P-LDD structure is formed, the reverse withstand voltage of the PN junction at the boundary 40 between the P-type diffusion layer 38 and the N-type diffusion layer 20 being decreased, so that the trigger voltage for thyristor operation is lowered, thereby improving the protective capacity.

This type of semiconductor protective element of the past is effective with respect to an external pulse having a slow rise time. However, it is poor in protective capacity with respect to a pulse having a fast rise time.

In particular, there is a known charged device model (CDM) mode static pulse in which the rise time is extremely fast, this being 500 ps or shorter, and having a large discharge current of 10 A or more, thereby causing failures of the gate oxide film or the like in a fine-featured MOS LSI element. The protective element of the past is particularly troubled with a low capacity to provide protection for such fast mode static pulses as these.

By various simulations, the inventors, as a result of an investigation of the cause of the low protective capacity of this type of protective element with respect to a CDM mode pulse, were able to discover the cause thereof.

Specifically, there are two causes, which differ depending upon whether the overvoltage is positive or negative.

For example, in the first case, in which a positive overvoltage is applied to a semiconductor protective element of this type from the prior art, the element operates as a thyristor, but the starting speed is slow, so that a voltage greater than the breakdown voltage is applied to the internal circuit, thereby causing a low breakdown withstand voltage with respect to a fast pulse.

Additionally, in accordance with the simulations performed by the inventors, it was discovered that the starting speed is dependent upon the distance Dac between the anode and the cathode electrodes of the thyristor element.

Specifically, FIG. 10 shows the results of a simulation for the case in which a thyristor element of the past is used as a protective element, with a CDM mode static electricity pulse of 1000 V applied, in which the relationship between the voltage VoxMAX applied to the internal circuitry to be protected and the distance Dac between the anode and cathode of the thyristor element is shown.

As is clear from FIG. 10, to reduce the maximum voltage VoxMAX applied to the internal circuit, it is necessary to reduce the distance Dac between the anode electrode and the cathode electrode of the thyristor element.

However, it was difficult to reduce this distance with the structure of the past. That is, in FIG. 6, which shows the configuration of prior art as disclosed in the U.S. Pat. No. 5,502,317, the reference numeral 146 denotes the anode electrode and 112 denotes the cathode electrode, there being an N-type diffusion layer 114 and element separation film 124 therebetween, which restricts the reduction of the anode-to-cathode distance Dac.

In FIG. 7, which shows the configuration of the specification of the U.S. Pat. No. 5,872,379 which discloses prior art, the reference numeral 34 denotes the anode electrode and 18 denotes the cathode electrode, between which are interposed an N-type diffusion layer 20 and a P-type diffusion layer 38, which make reduction of Dac difficult.

The second case is that in which a negative CDM mode pulse is applied to a protective element of the past. The reason for a reduction in protective capacity in this case is that the element operates as a diode, wherein parasitic resistance of the element causes a rise in the voltage of the circuit to be protected.

That is, in the case of a CDM mode static discharge, because of the large discharge current, with even a small parasitic resistance, there is a rise in the voltage generated at the element terminals, thereby causing breakdown of the internal circuit.

The inventors discovered by their simulations that the parasitic resistance is substantially proportional to the distance between the diode cathode and anode. It is therefore desirable to reduce the distance between the cathode and the anode of the diode, although this was difficult to achieve in the structure of the past.

Specifically, in the structure disclosed in U.S. Pat. No. 5,872,379, for diode operation, the N-type diffusion layer 20 acts as the cathode electrode and the P-type diffusion layer 14 acts as the anode electrode, with an N-type electrode 18 and a P-type electrode 38 interposed therebetween, so that there is a limitation on the reduction of the distance therebetween that can be achieved.

Additionally, in Japanese Patent No. 2669245, there is disclosure of a configuration which uses a junction-type field effect transistor as a protective element.

However, there is no language therein with regard to technology for using a protective circuit having a thyristor structure with respect to CDM mode static discharge in a fine-featured semiconductor device.

Additionally, in the Japanese Unexamined Patent Publication (KOKAI) No. 59-181044, there is disclosure of a configuration which uses a protective circuit having two diode and resistance stages as a gate protective circuit for an MOS FET. However, there is no language therein with regard to technology for using a protective circuit with a thyristor structure with respect to a CDM mode static discharge in a fine-featured semiconductor device.

Additionally, in the Japanese Unexamined Patent Application S62-165966, there is indicated a configuration in which a Zener diode is used as a protective circuit for a semiconductor element. However, there is no language therein with regard to technology for using a protective circuit having a thyristor structure with respect to a CDM mode static discharge in a fine-featured semiconductor device, similar to the case of the previously noted disclosure.

In the Japanese Unexamined Patent Publication (KOKAI) No. 9-223748, there is disclosure of a configuration in which, as a protective circuit, a diode and the parallel connection of an MOS FET and protective transistor are connected to the input terminals. However, similar to the case of the foregoing disclosure, there is no language therein with regard to technology for using a protective circuit having a thyristor structure with respect to a CDM mode static discharge in a fine-featured semiconductor device.

In the Japanese Unexamined Patent Publication (KOKAI) No. 9-191082, there is disclosure of a technology for using a thyristor structure as a protective circuit for a CMOS circuit. However, the basic configuration is a vertical-type MOS, and because an oxide film is formed as a separating layer between the thyristor structure, the distance between electrodes is lengthened, thereby making it impossible to accommodate high-speed pulses.

In this disclosure, there is no language with regard to technology for driving a diode as a trigger for the thyristor.

Accordingly, it is an object of the present invention, in order to improve on the drawbacks of the above-noted prior art, to provide a protective element structure which, without the addition of a special process step when manufacturing, for example, in a CMOS LSI of the past, enables on-substrate fabrication, and further provides high protection capacity with respect to a fast pulse such as a CDM mode static pulse. It is a further object of the present invention to provide a method for manufacturing a semiconductor protective device.

SUMMARY OF THE INVENTION

In order to achieve the above-noted object, the present invention has the following basic technical constitution.

Specifically, a first aspect of the present invention is a semiconductor protective device having a first well of a first conductive type, a second well of a second conductive type, being directly connected to said first well, a third well of a first conductive type being directly connected to one side of said second well which being opposite to the side thereof to which said first well being connected, each three wells being formed on a substrate, a first diffusion layer of a first conducive type formed within said second well of the second conductive type, a second diffusion layer of a second conducive type formed within said first well of said first conductive type and provided in proximal opposition to said first diffusion layer, a third diffusion layer of a second conductive type provided at a position over a boundary portion of said second well of a second conductive type and said third well of a first conductive type so as to bridge therebetween, said position being different from a position over a boundary portion of said second well of a second conductive type and said first well of a first conductive type where said first diffusion layer and said second diffusion layer being arranged in proximal opposition, and a fourth diffusion layer of a first conductive type provided within said third well of said first conductive type and which formed in proximate opposition to said third diffusion layer of said second conductive type, wherein said first and said third diffusion layers are connected to a first terminal, while said second and said fourth diffusion layers being connected to a second terminal.

A second aspect of the present invention is a method for manufacturing a semiconductor protective device, this method having a step of disposing a first mask material on at least part of a semiconductor substrate and implanting a second conductivity ion therein to form a second well of a second conductivity type, a step of forming a second mask material minimally in a region in which said second well region is formed and implanting a first conductivity ion in a region that is directly in contact with said second well region but outside said second well region, so as to form a first well of first conductivity type and a third well of a first conductivity type, a step of forming a third mask material having a first aperture formed at a position opposite a region that minimally bridges said third well region and said second well region and a second aperture formed at a position in said first well region and nearly opposite to said second well of said second conductivity type region, and implanting a second conductivity ion, so as to form a third and a second diffusion layers of said second conductivity, respectively, a step of forming a fourth mask material having a third aperture formed in said second well region, minimally at a position corresponding to a region in proximal opposition to said second diffusion layer formed in said first well region and a fourth aperture formed at a position in said third well region and corresponding to a region in proximal opposition to said third diffusion region in said second well region, and implanting a first conductivity ion so as to form a first diffusion layer and a fourth diffusion layer of said first conductivity type, respectively.

By adopting the above-noted constitution, a semiconductor protective device and method for manufacturing a semiconductor protective device according to the present invention provide a thyristor element having the first diffusion layer as an anode and the second diffusion layer as a cathode, which operates in this manner when a positive overvoltage pulse is applied.

Under the above condition, it is possible to reduce the distance between the anode and the cathode within the limits of manufacturing technology for LSI devices. For example, in the case of a CMOS LSI device having a 0.25 µm design rule, this distance can be established as 1 µm or smaller.

Therefore, even if a fast positive static pulse, such as a CDM mode pulse is applied, the response speed of the protective element is fast, thereby enabling limitation of the voltage rise applied to the circuit under protection.

In the case of a negative overvoltage, the operation is as a diode having the third diffusion layer as a cathode and the fourth diffusion layer as an anode. In this case, because it is also possible to reduce the distance between the cathode and the anode within the limits of manufacturing technology, it is possible to form a diode with extremely low internal resistance. For this reason, even in the case of an excessive discharge current value, it is possible to limit the voltage rise in the internal circuit.

BRIEF DESCRIPTION OF THE DRAWINGS

FIG. 1 $\mu$A) showing a plan view thereof, and FIG. 1(B) showing a cross-sectional view thereof, along the line a–a' of FIG. 1(A).

DETAILED DESCRIPTION OF THE PREFERRED EMBODIMENTS

Preferred embodiments of the present invention are described below in detail, with references made to relevant accompanying drawings.

Figure 1A:
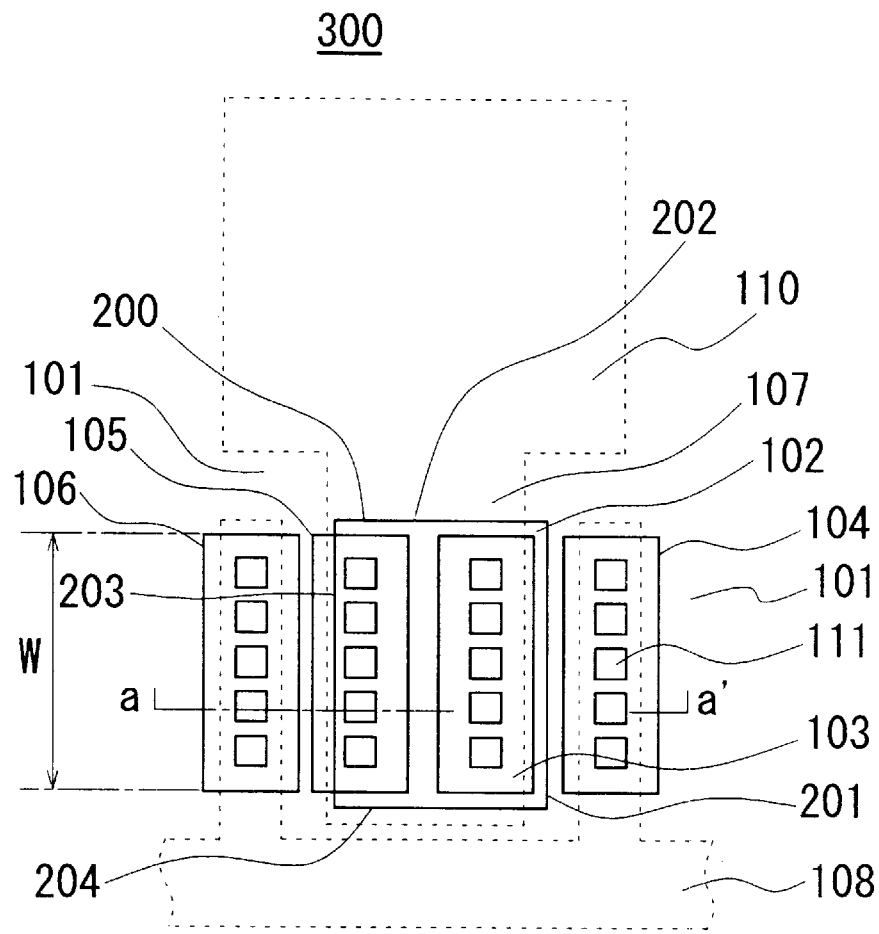
FIG. 1 is a drawing showing the general configuration of an example of a semiconductor protective device according to the present invention.
Figure 1B:
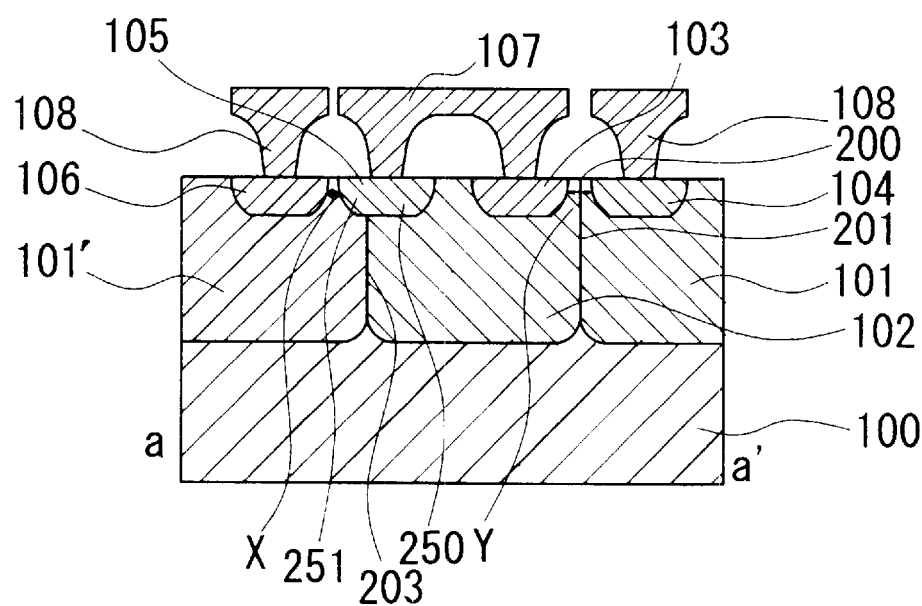

Specifically, FIG. 1(A) is a plan view showing a specific configuration of a semiconductor protective device according to the present invention, and FIG. 1(B) is a cross-sectional view thereof. These drawings show a semiconductor protective device 300 having a first well of a first conductive type 101, a second well of a second conductive type 102, being directly connected to said first well 101, a third well of a first conductive type 101' being directly connected to one side of said second well 102 which being opposite to the side thereof to which said first well 101 being connected, each three wells being formed on a substrate 100, a first diffusion layer of a first conducive type 103 formed within said second well of the second conductive type 102, a second diffusion layer of a second conducive type 104 formed within said first well of said first conductive type 101 and provided in proximal opposition to said first diffusion layer 103, a third diffusion layer of a second conductive type 105 provided at a position over a boundary portion 203 of said second well of a second conductive type 102 and said third well of a first conductive type 101' so as to bridge therebetween, said position 203 being different from a position 200 over a boundary portion of said second well of a second conductive type 102 and said first well of a first conductive type 101 where said first diffusion layer 103 and said second diffusion layer 104 being arranged in proximal opposition, and a fourth diffusion layer of a first conductive type 106 provided within said third well of said first conductive type 101' and which formed in proximate opposition to said third diffusion layer of said second conductive type 105, wherein said first and said third diffusion layers 103, 105 are connected to a first terminal 107, while said second and said fourth diffusion layers 104, 106 being connected to a second terminal 108.

Note that, in the present invention, as shown in FIG. 1(A), the second well 102 is surrounded by the first well 101 but FIG. 1(B) shows that the second well 102 is sandwiched with the first well 101 and thus in order to easy explanation about this configuration of the present invention, the left hand side first well portion is referred to a third well region 101' although the third well region 101' and the first well region 101 are integrally formed.

In FIG. 1, the reference numeral 110 denotes a terminal interconnect that is connected to a metal interconnect formed as the first terminal 107, and the reference numeral 111 denotes a contact hole.

FIG. 1(B) is a cross-sectional view seen along the line a–a' of FIG. 1(A).

This drawing shows a specific example of a semiconductor protective device 300 according to the present invention as shown in FIG. 1, in which the second conductivity well 102 is formed as an island within the well 101 of the first conductivity, the first and second diffusion layers 103 and 104 being disposed in proximity and so as to surround the boundary 201 between the first conductivity well 101 and second conductivity well 102, and the third diffusion layer 105 being disposed within both wells so as to bridge the boundary edge 203 between the third conductivity well 101' and the second conductivity well 102 which is located in opposition to the boundary edge 201 formed between the first conductivity well 101 and the second conductivity well 102.

In this device, the fourth diffusion layer 106 is shown as formed within the third conductivity well 101' in proximity to and parallel to the third diffusion layer 105.

As shown in FIG. 1, in this example of the present invention, it is not necessary to have the first to fourth diffusion layers disposed in series. For example, it is possible to have the third and fourth diffusion layer 105 and 106 or the like disposed at a position 202 or 204 forming the boundary between the first conductivity well 101 and the second conductivity well 102.

In the present invention, the first terminal 107 and the terminal interconnect 110 connected thereto are the input terminals of the semiconductor device requiring protection, and the second terminal 108 is desirably made a ground terminal.

It is desirable that the semiconductor circuit to be protected by the present invention be constituted of MOS semiconductor elements, specifically the MOS integrated circuit to be protected by the present invention can include an inverter circuit formed by at least one P-type MOS transistor and one N-type MOS transistor, the gate of which is an input/output signal terminal, and the source of the N-type MOS transistor of which is a ground terminal, thereby forming a CMOS inverter.

The semiconductor protective device 300 of the present invention is formed mainly by MOS transistors, so that it is desirable that the semiconductor device to be protected thereby, for example, is a device formed by MOS semiconductor elements, thereby enabling use of common manufacturing processes, so as to improve efficiency and reduce costs.

As described above, in the semiconductor protective device 300 of the present invention, it is necessary to form a thyristor structure by the first diffusion layer 103, the second conductivity well 102, the first conductivity well 101, and the second diffusion layer 104, and also necessary to form a diode between the third diffusion layer 105 and the fourth diffusion layer 106.

The straight-line distance Y (i.e., Dac) between the first diffusion layer 103 and the second diffusion layer 104 forming the thyristor structure must be formed so as to be as short as possible, and this is desirably made 2 $\mu$m or less and further desirably made 1 $\mu$m or less.

In the same manner, in the present invention, it is desirable that the distance X between the third diffusion layer 105 and the fourth diffusion layer 106 in the diode formed between the third diffusion layer 105 and the fourth diffusion layer 106 be as short as possible.

In particular, the structure of the third diffusion layer 105 in the present invention, as shown in FIG. 1, is desirably formed so that the major portion thereof 250 is disposed within the second conductivity well 102, and so that the other part 251 of the third diffusion layer 105 is disposed within the third conductivity well 101'.

In the third diffusion layer 105 of the present invention, it is desirable that a contact 107 be connected to the surface at a position on the third diffusion layer 105 disposed within the second conductivity well 102.

It is a feature of the semiconductor protective device 300 according to the present invention that a diode formed between the third diffusion layer 105 and the the third well region of the first conductivity type 101' operate as a trigger that drives the thyristor structure.

The operation of the semiconductor protective device 300 according to the present invention is described details below.

Specifically, because the semiconductor protective device 300 of the present invention adopts the basic constitution described above, in the case of a positive overvoltage, operation is as a thyristor elements, with the first diffusion layer 103 acting as an anode, and the second diffusion layer 104 acting as a cathode.

In this mode, the distance Dac between the anode and the cathode can be reduced to within the allowable limits of LSI manufacturing technology, and this distance can be made 1 $\mu$m or less for the case of a CMOS LSI device having a 0.25 $\mu$m design rule.

Therefore, even if a high-speed positive static pulse such as a CDM mode pulse is applied, the response speed of the protective element is high, making it possible to limit the voltage rise applied to the circuit under protection.

In the case of a negative overvoltage, the operation is as a diode having the third diffusion layer 105 acting as a cathode and the fourth diffusion layer 106 acting as an anode. In this mode, it is also possible to reduce the distance between the cathode and the anode within the allowable limits of manufacturing technology, thereby enabling the achievement of a diode with an extremely low internal resistance. For this reason, even in the case of a large discharge current value, it is possible to limit the voltage rise in the internal circuit.

More specifically, in the present invention, in the case of application of a positive overvoltage to the terminal 110 of FIG. 1, the operation of the semiconductor protective device 300 is as a PNPN thyristor element formed by a P-type diffusion layer 103, and N-type well 102, a P-type well 101, and an N-type diffusion layer 104, so that the internal resistance is greatly reduced.

Figure 10:
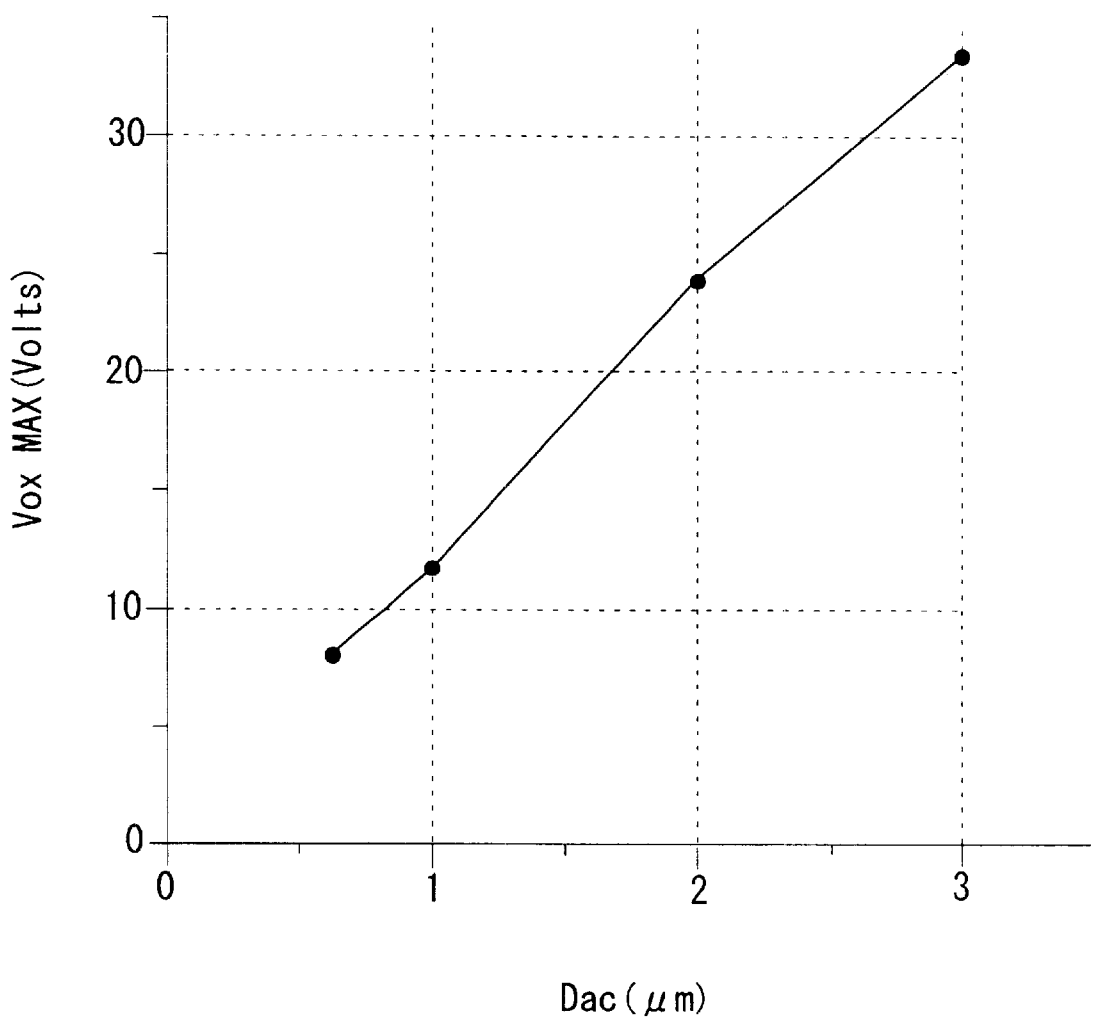
FIG. 10 is a graph that shows the relationship between the anode-to-cathode distance of a protective element when a 1000-volt CDM mode static pulse is applied to the input circuit, into which the semiconductor protective device of the present invention is built, as a main protection element, with the maximum voltage VoxMAX applied to the internal circuit.

Under this condition, if the distance Dac between the anode electrode (P-type diffusion layer 103) and the cathode electrode (N-type diffusion layer 104) is 1 $\mu$m or smaller, the starting speed of the semiconductor protective circuit 300 is high, so that in accordance with FIG. 10, even if a CDM mode pulse of 1000 V is applied, the voltage rise in the internal circuit is limited to less than 15 volts. Advances in manufacturing technology enable Dac to be made very small.

Specifically, even if the intrinsic withstand voltage of the gate oxide film used in the internal circuit is reduced because of a reduction in design rule, by limiting the voltage rise in the internal circuit when an overvoltage is applied is limited to below the withstand voltage by the appropriate establishment of the distance Dac, it is possible to protect the internal circuit from breakdown.

If a negative overvoltage is applied to the terminal 110 of FIG. 1, the semiconductor protective circuit 300 operates as a diode having the N-type diffusion layer 105 acting as a cathode electrode and the P-type diffusion layer 106 acting as an anode electrode. In this mode, because the structure is such that the distance between the anode electrode and the cathode electrode is minimized, the internal resistance during operation does not exceed 1 ohm. Therefore, even if the discharge current maximum value is 10 A, the voltage across the terminals of the protective element does not exceed 10 V.

In the semiconductor protective device 300 according to the present invention, upon investigating the cause for the effective operation of the thyristor structure, it was verified that, because of the phenomenon describe below, the above-noted thyristor structure is driven at a high speed.

Figure 8:
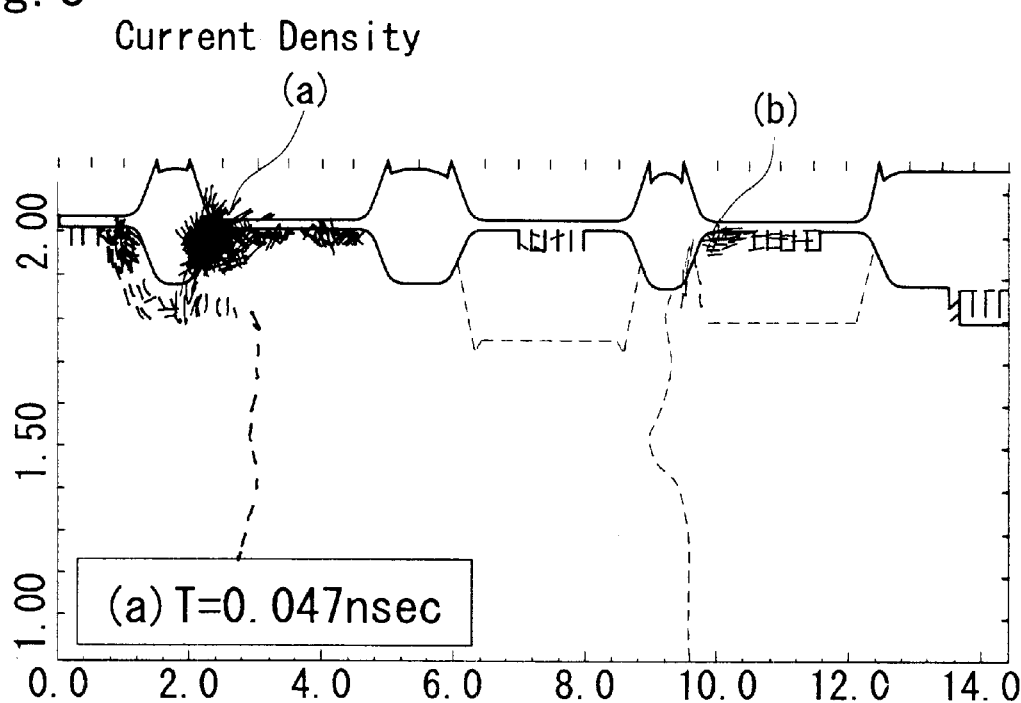
FIG. 8 is a drawing illustrating operation of a part of a semiconductor protective device according to the present invention.

Specifically, in the present invention, when a positive overvoltage is applied to the terminal 110 of FIG. 1, as shown in FIG. 8($a$), when the pulse is at its initial rise, the diode formed at the junction between the N-type diffusion layer 105 and the P-type well 101 exhibits an avalanche breakdown, so that reverse current flows.

Because this current increases the potential on the overall P well, the potential at the anode side of the diode formed by the N-diffusion layer 104 fixed at the ground potential and the P-type well 101 rises, so that there is a partial forward current flow as shown in FIG. 8($b$).

This is because this current is the base current of an NPN bipolar transistor formed by the N-type well 102, the P-type well 101, and the N-type diffusion layer 104, thereby resulting in conduction of this NPN bipolar transistor, which results in a flow of current from the N-type diffusion layer 105 which is the collector electrode into the N-type diffusion layer 104 which is the emitter electrode.

Because of the voltage drop caused by this collector current, the potential of the N-type well in the vicinity of the junction formed by the P-type diffusion layer 103 and the N-type well 102 decreases, so that a forward current flows from the P-type diffusion layer 103 to the N-type well 102.

Figure 9:
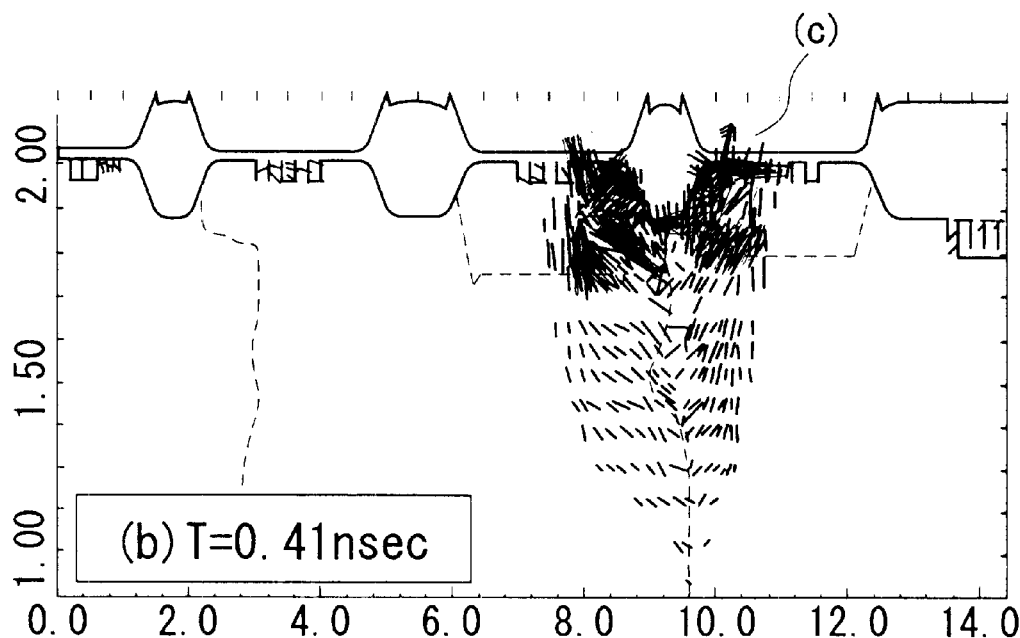
FIG. 9 is a drawing illustrating operation of a part of a semiconductor protective device according to the present invention.

This is because the current is the base current of a PNP bipolar transistor formed by the P-type diffusion layer 103, the N-type well 102, and the P-type well 101, so that the PNP transistor conducts, the result being, as shown in FIG. 9(c), that the collector current flows from the P-type diffusion layer 103 to the P-type well 101.

The collector current of the above noted NPN transistor and PNP transistor are the base currents of the opposing transistor, so that they act to strengthen the collector current. Essentially, this forms a PNPN thyristor action, so that before the voltage on the internal circuit rises and the overvoltage pulse reaches a peak, a large amount of current flows through the low internal resistance thereby protecting the internal circuit.

Specifically, it was discovered that in the semiconductor protective device 300 of the present invention, when a positive CMD mode pulse is applied to the input terminal, a diode formed between the third diffusion layer 105 and first conductivity well 101 or between the third diffusion layer 105 and the fourth diffusion layer 106 acts as a trigger for the thyristor structure.

Next, a detailed description of the case in which a semiconductor protective device 300 according to the present invention is built into a semiconductor device is presented below, with references made to FIG. 2 and FIG. 3.

Figure 2:
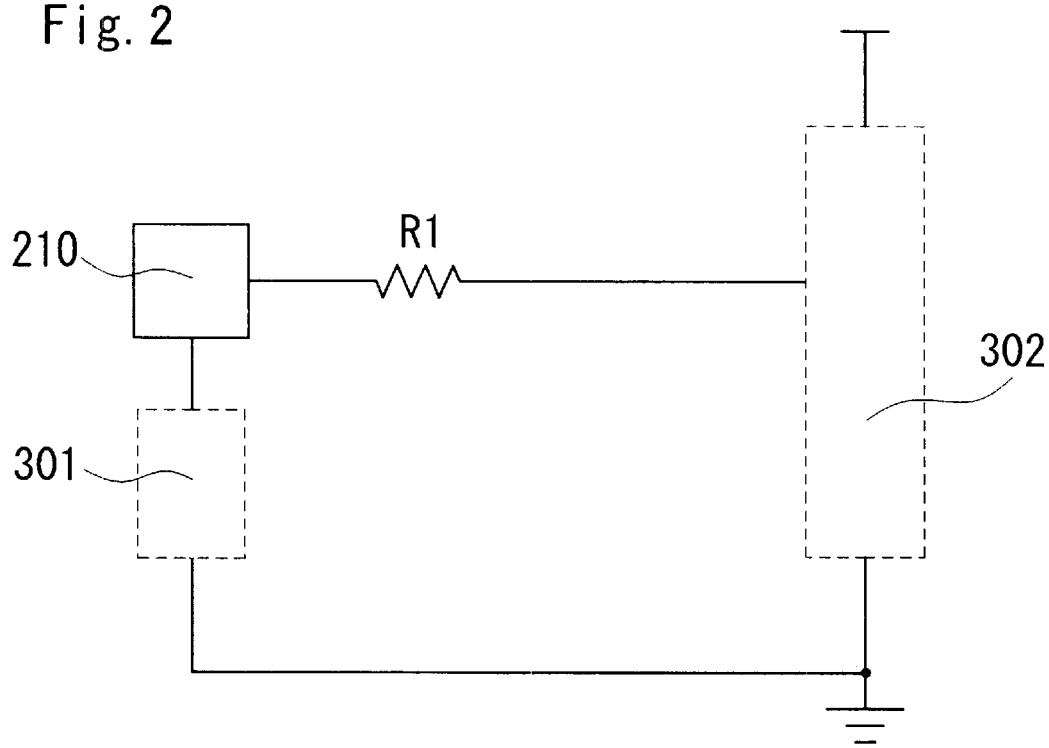
FIG. 2 is a block diagram showing an example of an input circuit in which a semiconductor protective device according to the present invention has been built in as a main protective element.

Specifically, FIG. 2 shows an example in which a protective element 300 of the present invention, shown in FIG. 1, is built into the input circuit of an integrated circuit.

Specifically, in FIG. 2, there is an internal circuit 302 connected via a resistance R1 which has a terminal 210 as an external connection terminal, and a semiconductor protection device 301 of the present invention, having an element width W of 50 μm is interposed between this external terminal 210 and the ground interconnect.

Specifically, as shown in FIG. 2, in this example of the present invention, a MOS-type integrated circuit 302 to be protected that has at least one ground terminal and one input/output signal terminal, and which is formed on a semiconductor substrate, is connected to an external terminal via a first resistance connected to the input/output signal terminal provided on the substrate, the semiconductor protective device 301 according to the present invention being connected to the second terminal of the external terminal 210.

Essentially, in the example shown in FIG. 2, when a high-speed overvoltage is applied to the terminal 210, the protective element 302 goes into the conducting condition, as described above, so that current flows, thereby clamping the voltage across the terminals.

The resistance R1 prevents a rise in the voltage of the internal circuits before the protective element starts to conduct, at the initial 200 ps of the overvoltage.

The value of R1 should be in a range from 50 ohm to 200 ohm. By using a protective element having a width W of 50 μm, even in the case of a slow static pulse in the human body model(HBM) mode which has a high energy and an overvoltage that would cause thermal breakdown of the protective elements itself, the protective element itself is not destroyed.

Figure 3:
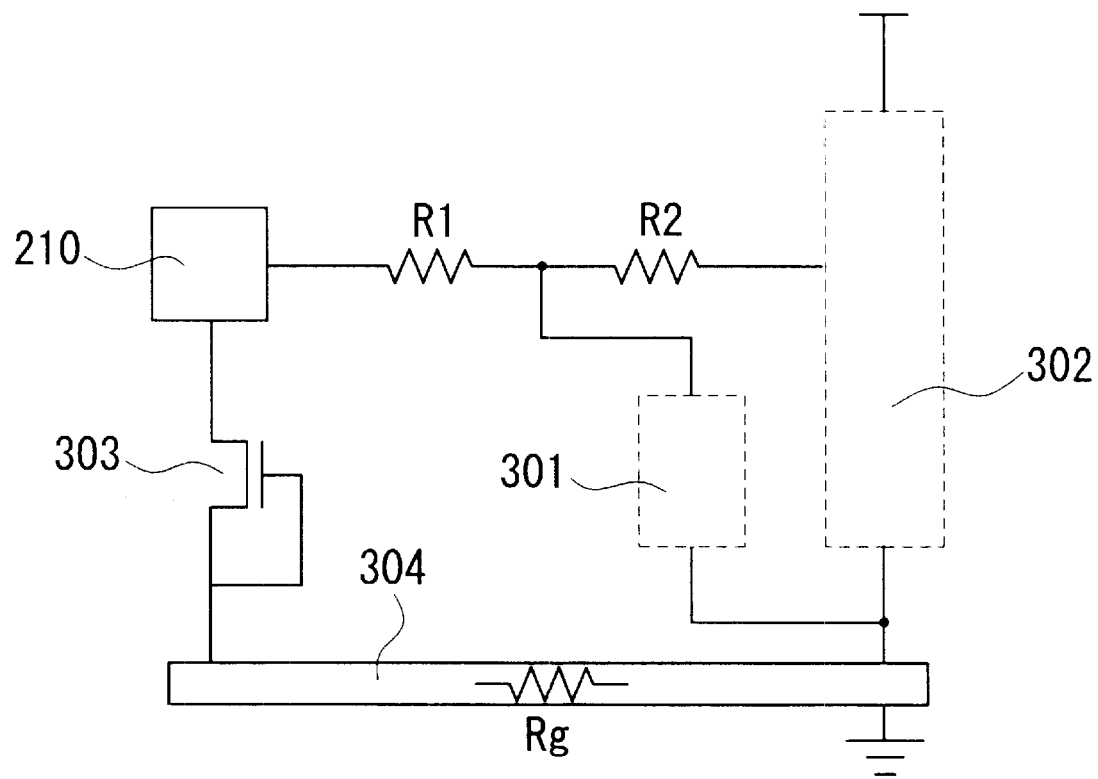
FIG. 3 is a block diagram showing an example of an input circuit in which a semiconductor protective device according to the present invention is built in as an auxiliary protective element.

FIG. 3 shows another example, in which the protective element 300 of the present invention is built in as an auxiliary protective element of the input circuit of an integrated circuit.

Specifically, in FIG. 3, the element 210 is an external connection terminal, there being an internal circuit 302 connected thereto via the series connection of resistances R1 and R2, an N-type MOS FET 303 having a grounded gate being connected between the terminal 210 and the ground interconnect 304 as a main protective element.

The protective element 301 of the present invention is built in between the junction point between the resistances R1 and R2 and the ground interconnect connection point. In this case, a protective element has a width W of 10 μm.

More specifically, a semiconductor protective device 300 according to this example of the present invention has a MOS-type integrated circuit to be protected with at least one ground terminal and one input/output signal terminal, formed on a semiconductor substrate, an external terminal formed on the semiconductor substrate, a first and a second resistor connected in series with one another, a first protective element, and a ground interconnect formed by a metal.

The first resistor is connected to the junction between the external terminal and the second resistor, and the second resistor is connected between this junction point and at least one of the input/output signal terminals, the first protective element being connected between the external terminal and one end of the metal ground interconnect, and another end of the metal ground interconnect being connected to at least one ground terminal of the MOS-type integrated circuit.

The first terminal of a semiconductor protective device 300 configured in this manner is connected to the external terminal, and the second terminal is connected to the ground terminal, the first terminal being connected to the contact point 1 and the second terminal of the second semiconductor protective device being minimally connected to one of the ground terminals of the MOS-type integrated circuit.

That is, in the example shown in FIG. 3, in the case in which there is no auxiliary protective element when a high-speed overvoltage is applied to the terminal 210, the N-type MOS transistor of the main protective element operates as a parasitic bipolar device, so that discharge current flows from the main protective element to the ground point, via the ground interconnect 304. When this occurs, because the internal resistance of the main protective element is high, and also because of the parasitic resistance Rg of the ground interconnect, a high voltage occurs between the external terminal 310 and the ground point.

For example, in the case in which a 10-A static pulse in the CDM mode is applied, if the internal resistance o[0086] the main protective element is 2 ohm and Rg is 1 ohm, a voltage of 30 V develops between 310 and the ground terminal, so that there is a high possibility of damage to the internal circuit 302 which inputs a signal from the external terminal.

As shown in FIG. 3, if a protective element of the present invention is introduced as the auxiliary protective element 301, the auxiliary protective element is started at a high speed, based on the same principle as described earlier, and the internal resistance is greatly reduced, so that the voltage applied to the internal circuit is limited. In the case in which an HBM mode pulse is applied which would cause thermal destruction, because of the resistance R1, there is almost no current flowing in the main protective element 303.

By making the width of the main protective element large, it is possible to prevent destruction of the main protective element itself. Because an HBM mode static pulse does not reach the auxiliary protective element, even if the width of the element in the auxiliary protective element is reduce to 10 μm, there is no destruction of the auxiliary element itself, and the reduction of the size reduces the amount of surface area occupied by the auxiliary protective element on the chip.

The value of the resistance R2 is such that it prevents a rise in voltage applied to the internal circuit during the initial 200 ps before the auxiliary protective element begins to operate. For example, the resistance R1 is made 50 ohm and the resistance R2 is made 50 ohm.

Next, a method for manufacturing a semiconductor protective device 300 will be explained precisely, as followed, A first aspect of the method for manufacturing a semiconductor protective device in the present invention is such that which comprising, a step of disposing a first mask material on at least part of a semiconductor substrate and implanting a second conductivity ion therein to form a second well of a second conductivity type, a step of forming a second mask material minimally in a region in which said second well region is formed and implanting a first conductivity ion in a region that is directly in contact with said second well region but outside said second well region, so as to form a first well of first conductivity type and a third well of a first conductivity type, a step of forming a third mask material having a first aperture formed at a position opposite a region that minimally bridges said third well region and said second well region and a second aperture formed at a position in said first well region and nearly opposite to said second well of said second conductivity type region, and implanting a second conductivity ion, so as to form a third and a second diffusion layers of said second conductivity, respectively, and a step of forming a fourth mask material having a third aperture formed in said second well region, minimally at a position corresponding to a region in proximal opposition to said second diffusion layer formed in said first well region and a fourth aperture formed at a position in said third well region and corresponding to a region in proximal opposition to said third diffusion region in said second well region, and implanting a first conductivity ion so as to form a first diffusion layer and a fourth diffusion layer of said first conductivity type, respectively.

Further, a second aspect of the method for manufacturing a semiconductor protective device in the present invention is such that which comprising, a step of disposing an island-shaped first mask material on at least part of a semiconductor substrate and implanting a second conductivity ion therein to form an island-shaped second well region of a second conductivity type, a step of disposing a second mask material minimally in a region in which said second well region is formed and implanting a first conductive ion in a region outside said second well region, so as to form a first well region and a third well region of a first conductive type, a step of forming a third mask material having a first aperture formed at a position corresponding to a region that minimally bridges said third well region and said second well region and a second aperture formed at a position in said first well region and oppositely close to said second well region and implanting a second conductive ion into said second well region, so as to form a third diffusion layer and a second diffusion layer, respectively, and a step of forming a fourth mask material having a first aperture formed minimally in said second well region and at a position corresponding to a region in proximal opposition to said second diffusion layer in said first well region and a second aperture formed minimally in said third well region and at a position oppositely corresponding to said third diffusion layer, and implanting a first conductivity ion so as to form a first diffusion layer in said first well region and a fourth diffusion layer in said third well region, respectively.

Next, a specific example of the method of manufacturing a semiconductor protective device 300 according to the present invention is described in detail below, with reference being made to FIG. 4.

Figure 4A:
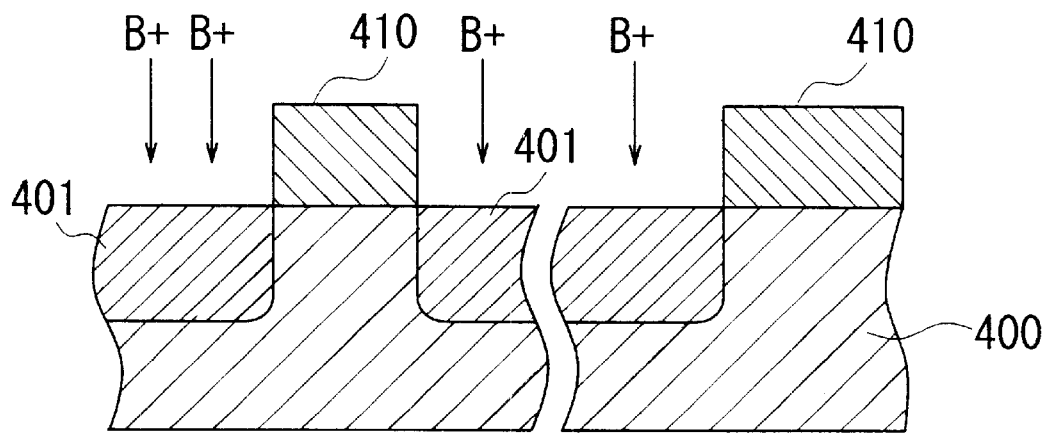
FIG. 4 is a cross-sectional view illustrating an example of the constitution of a method for manufacturing a semiconductor protective device according to the present invention.

Specifically, as shown in FIG. 4(A), a mask material 410 is formed onto a silicon semiconductor substrate 400 and boron (B) ions are implanted therein, to form a P-type well 401 (corresponding to the first well 101 and the third well 101') having a depth of approximately 2 μm, with an impurity concentration of approximately $5\times10^{17}/cm^3$.

Figure 4B:
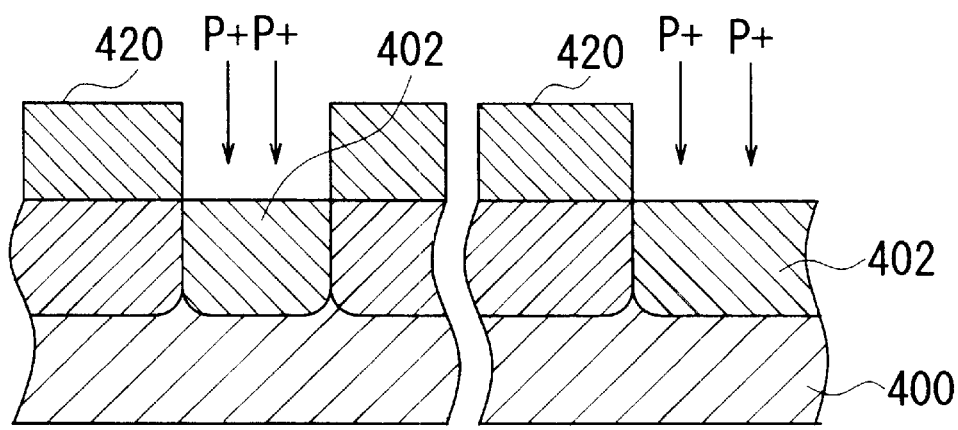
Figure 4C:
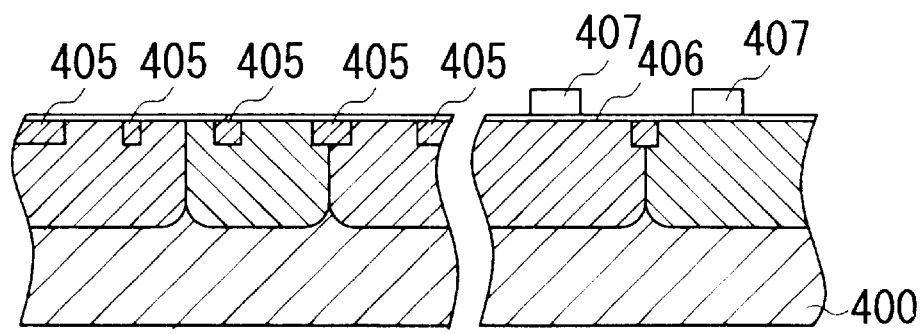

Next, as shown in FIG. 4(B), in a region in which the above-noted P-type well is formed, a mask material 420 is formed and phosphorus (P) ions are implanted therein, to form an N-type well 402 having a thickness of approximately 2 μm and an impurity concentration of approximately $5\times10^{17}/cm^3$, after which the mask material is removed, as shown in FIG. 4(C), to form a silicon dioxide film element separation 405 having a depth of approximately 400 nm in the form of a trench, a gate oxide film 406 having a thickness of approximately 8 nm being formed, after which a gate electrode 407 is formed using a polysilicon film.

Figure 5D:
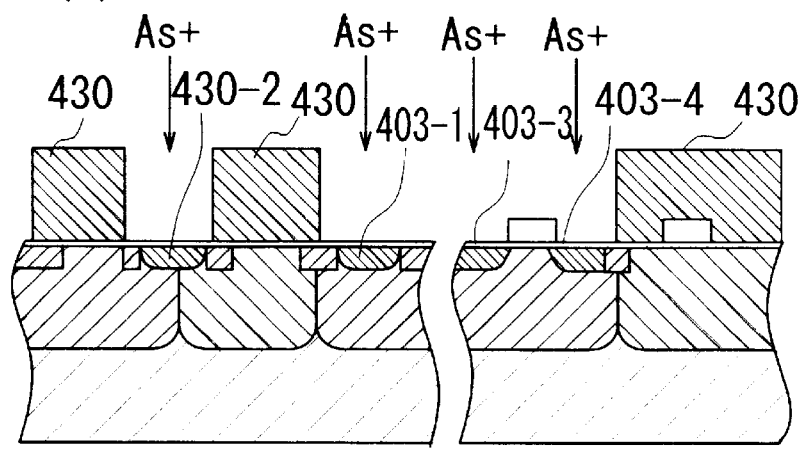
FIG. 5 is a cross-sectional view illustrating an example of the constitution of a method for manufacturing a semiconductor protective device according to the present invention.

After the above, as shown in FIG. 5(D), a mask material 430 is formed, and arsenic (As) ions are implanted therein to form the N-type diffusion layers 403-1, 403-2, and 402-3, and 403-4, which are self-aligned with respect to the element separation film and the gate electrode.

The concentration of the N-type diffusion layers is approximately $2\times10^{20}/cm^3$ and the thickness thereof is approximately 300 nm.

Figure 5E:
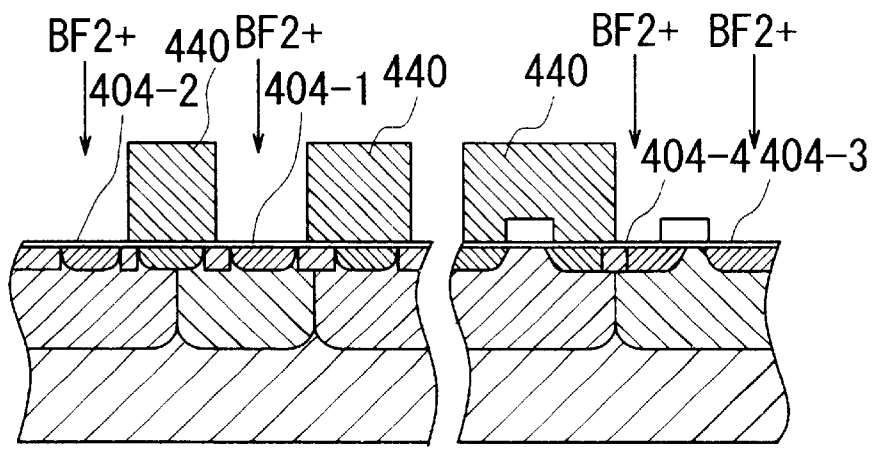

Next, the mask material 430 is removed, and as shown in FIG. 5(E), a mask material 440 is formed so as to cover part of the N-type diffusion layer, after which $BF_2$ ions are implanted therein to form the P-type diffusion layers 404-1, 404-2, 404-3, and 404-4, which are self-aligned with respect to the element separation film and the gate electrode.

Figure 5F:
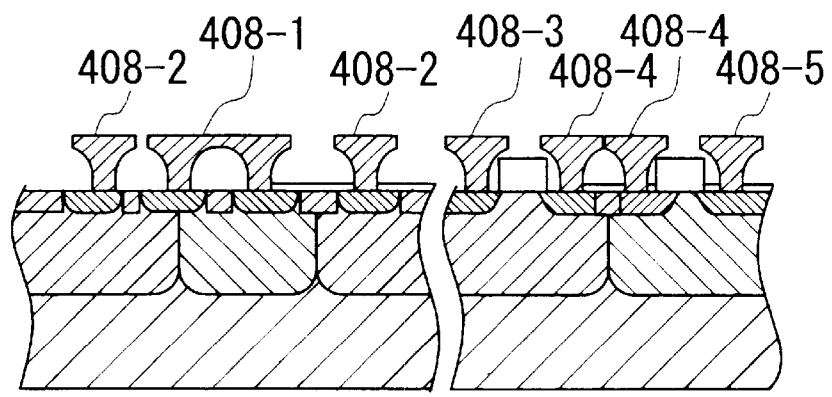
Figure 6:
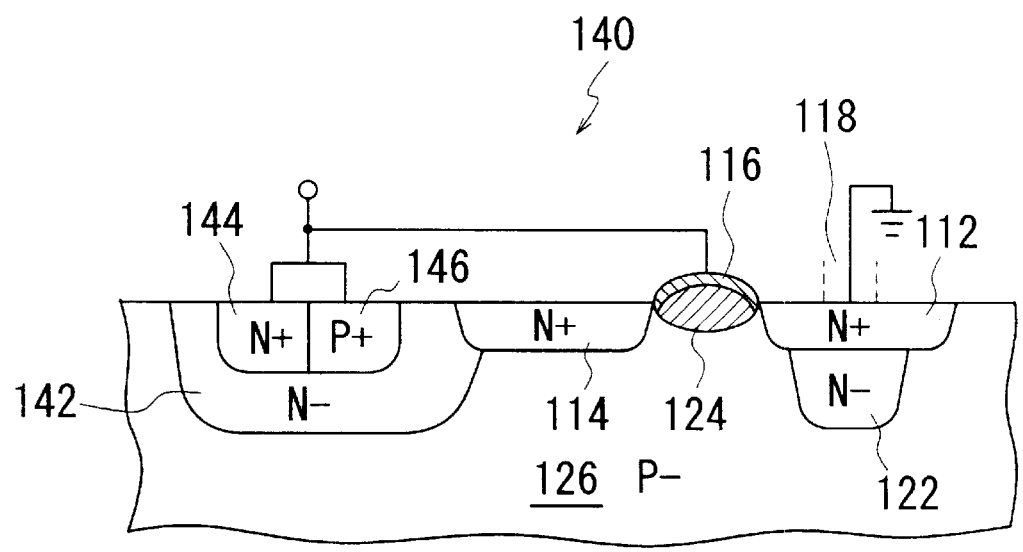
FIG. 6 is a cross-sectional view showing an example of the configuration of a semiconductor protective device of the past.
Figure 7:
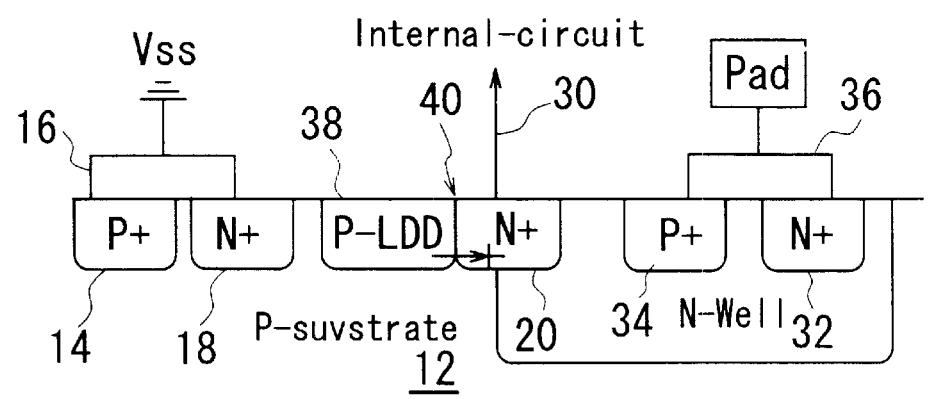
FIG. 7 is a cross-sectional view showing an example of the configuration of a semiconductor protective device of the past.

The concentration in the P-type diffusion layers is approximately $1\times10^2/cm^3$, and the thickness thereof is approximately 300 nm. The mask material is removed, and as shown in FIG. 5(F), interconnect contacts 408-1, 408-2, 408-3, 408-4, and 408-5 are formed on each of the N-type and P-type diffusion layers.

Ultimately, the diffusion layer 404-1 corresponds to the first diffusion layer of the protective element of the present invention, the diffusion layer 403-1 corresponds to the second diffusion layer thereof, the diffusion layer 403-2 corresponds to the third diffusion layer thereof, and the diffusion layer 404-2 corresponds to the fourth diffusion layer thereof.

The diffusion layers 403-3 and 403-4 correspond to the drain and source diffusion layers of an N-type MOS transistor forming the internal circuit, and the diffusion layers 404-3 and 404-4 correspond to the drain and the source of the P-type MOS transistor forming the internal circuit.

The metal interconnect 408-1 is connected to the external terminal, the metal interconnect 408-2 is connected to the ground interconnect, the metal interconnect 408-3 is connected, for example, to a ground interconnect, the metal interconnect 408-4 is connected to another connection point on the internal circuit, and the metal interconnect 408-5 is connected, for example, to a power supply terminal.

As described in detail above, a semiconductor circuit using a protective element according to the present invention prevents breakdown of the internal circuit even in the case of a high-speed pulse such as a CDM mode pulse, thereby enabling a high static electric withstand voltage.

The reason for this is that it is possible to make the distance between the anode and the cathode when the protective element operates as a thyristor and the distance between the anode and the cathode when the device operates as a diode minimum, and by doing so it is possible to achieve a fast element startup, thereby reducing the internal resistance.

In addition, with further advances in reduction of the feature size of integrated circuits, the distance between the anode and the cathode can be further reduced, thereby preventing a reduction in withstand voltage that accompanies a reduction of feature size in device elements.

Additionally, because it is possible to form a protective element according to the present invention on one and the same chip as a normal CMOS LSI manufacturing process, without adding an extra process step, it is possible to improve static electricity breakdown protection without adding to the cost of the device.

What is claimed is:

1. A semiconductor protective device comprising:
   a first well of a first conductive type;
   a second well of a second conductive type, being directly connected to said first well;
   a third well of a first conductive type being directly connected to one side of said second well which being opposite to the side thereof to which said first well being connected, each three wells being formed on a substrate;
   a first diffusion layer of a first conducive type formed within said second well of the second conductive type;
   a second diffusion layer of a second conducive type formed within said first well of said first conductive type and provided in proximal opposition to said first diffusion layer;
   a third diffusion layer of a second conductive type provided at a position over a boundary portion of said second well of a second conductive type and said third well of a first conductive type so as to bridge therebetween, said position being different from a position over a boundary portion of said second well of a second conductive type and said first well of a first conductive type where said first diffusion layer and said second diffusion layer being arranged in proximal opposition; and
   a fourth diffusion layer of a first conductive type provided within said third well of said first conductive type and which formed in proximate opposition to said third diffusion layer of said second conductive type;
   wherein said first and said third diffusion layers are connected to a first terminal, while said second and said fourth diffusion layers being connected to a second terminal.

2. A semiconductor protective device according to claim 1, wherein said first terminal is an input terminal of a semiconductor device requiring protection, and wherein said second terminal is a ground terminal.

3. A semiconductor protective device according to claim 1, wherein said first diffusion layer, said second well of said second conductive type, said first well of said first conductive type and said second diffusion layer form a thyristor structure.

4. A semiconductor protective device according to claim 3, wherein a straight-line distance Dac from said first diffusion layer to said second diffusion layer is 2 $\mu$m or less.

5. A semiconductor protective device according to claim 3, wherein a straight-line distance Dac from said first diffusion layer to said second diffusion layer is 1 $\mu$m or less.

6. A semiconductor protective device according to claim 1, wherein a majority of location of said third diffusion layer is disposed within said second well of second conductive type, and wherein a contact is disposed at a location on the surface of said third diffusion layer disposed within said second well of said second conductive type.

7. A semiconductor protective device according to claim 3, wherein a diode formed between said third diffusion layer and said third well of said first conductive type operates as a trigger driving said thyristor structure.

8. A semiconductor protective device according to claim 1, wherein a semiconductor device to be protected is constituted by MOS-type semiconductor elements.

9. A semiconductor protective device according to claim 8, wherein said MOS-type integrated circuit device to be protected includes at least an inverter formed to one P-type MOS transistor and one N-type MOS transistor, the gate of which is said input/output signal terminal and the source of said N-type MOS transistor of which is said ground terminal.

10. A semiconductor protective device according to claim 1, wherein said second well is formed as an island within said first well, when view from above.

11. A semiconductor protective device according to claim 1, wherein said semiconductor protective device is used in combination with a MOS-type integrated circuit device to be protected having at least one grounded terminal and one input/output signal terminal and formed on a semiconductor substrate, an one external terminal formed on a semiconductor substrate and connected to said input/output signal terminal via a first resistance and further wherein a first terminal of said semiconductor protective device being connected to said external terminal while a second terminal thereof being connected to said ground terminal.

12. A semiconductor protective device according to claim 1, wherein said semiconductor protective device is used as a second protective element in combination with a MOS-type integrated circuit device to be protected having at least one grounded terminal and one input/output signal terminal, an one external terminal, a first and a second resistors connected in series with one another, a first protective element and a ground wiring each of which being formed on a semiconductor substrate, wherein said first resister is connected to a connection point formed between said external terminal and said second resistor which being connected to at least one input/output signal terminal of said MOS-type integrated circuit device, said first protective element being connected between said external terminal and one end of said ground wiring, another end of said ground wiring being connected to at least one ground of said MOS-type integrated circuit device, and further wherein a first terminal of said semiconductor protective device serving as said second protective element, is connected to said connecting point formed between said first and second resistors while a second terminal of said semiconductor protective device is connected to at least one ground terminal of said MOS-type integrated circuit device.

\* \* \* \* \*